(12) United States Patent
Kim et al.

(10) Patent No.: US 6,987,705 B2
(45) Date of Patent: Jan. 17, 2006

(54) MEMORY DEVICE WITH IMPROVED OUTPUT OPERATION MARGIN

(75) Inventors: Si-Hong Kim, Ichon-shi (KR); Young-Jin Yoon, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/875,496

(22) Filed: Jun. 25, 2004

(65) Prior Publication Data

US 2005/0105377 A1   May 19, 2005

(30) Foreign Application Priority Data

Oct. 31, 2003   (KR) ...................... 10-2003-0076834

(51) Int. Cl.
*G11C 8/00*   (2006.01)
(52) U.S. Cl. ................. 365/233; 365/189.05; 365/193; 365/194
(58) Field of Classification Search ........... 365/189.05, 365/193, 194, 233
See application file for complete search history.

(56) References Cited

U.S. PATENT DOCUMENTS

| | | | |
|---|---|---|---|
| 5,568,445 A | 10/1996 | Park et al. | |
| 5,652,724 A * | 7/1997 | Manning | ............... 365/189.05 |
| 5,933,379 A | 8/1999 | Park et al. | |
| 6,130,856 A | 10/2000 | McLaury | |
| 6,205,062 B1 | 3/2001 | Kim et al. | |
| 6,212,126 B1 * | 4/2001 | Sakamoto | ................... 365/233 |
| 6,215,722 B1 | 4/2001 | Park | |
| 6,385,709 B2 | 5/2002 | Merritt | |
| 6,424,594 B1 | 7/2002 | McLaury | |
| 6,452,866 B2 | 9/2002 | McLaury | |
| 6,483,769 B2 | 11/2002 | La | |
| 2002/0018395 A1 | 2/2002 | McLaury | |
| 2002/0093871 A1 | 7/2002 | Kwak | |

FOREIGN PATENT DOCUMENTS

| | | |
|---|---|---|
| JP | 11-203859 | 7/1999 |
| JP | 2002-133866 | 5/2002 |

* cited by examiner

*Primary Examiner*—Hoai Ho
(74) *Attorney, Agent, or Firm*—Mayer, Brown, Rowe & Maw LLP

(57) ABSTRACT

A synchronous memory device which generates a data output enable signal corresponding to a set CAS latency mode including: a control clock generator for generating an A-type first control clock and a B-type first control clock; a first redundancy enable signal generator for shifting an internal read signal by a predetermined interval in synchronization with one of the A-type first control clock and the B-type first control clock and generating a plurality of first redundancy enable signals; a second redundancy enable signal generator for synchronizing the plurality of first redundancy enable signals with a DLL clock and generating a plurality of second redundancy enable signals; and an output enable signal generator for selecting one redundancy enable signal corresponding to the set CAS latency mode among the first redundancy enable signals and the second redundancy enable signals and generating the selected redundancy enable signal as the data output enable signal.

10 Claims, 8 Drawing Sheets

MEMORY DEVICE WITH IMPROVED OUTPUT OPERATION MARGIN

FIELD OF THE INVENTION

The present invention relates to a semiconductor memory device; and, more particularly, to a data output control circuit for controlling data output in memory device.

DESCRIPTION OF RELATED ART

Developments on semiconductor memory devices have been kept on in order to obtain high integration and improved operating speed. Synchronous memory devices operating in synchronization with external clock have been introduced to improve the operating speed.

Among the synchronous memory devices, a single data rate (SDR) memory device inputs/outputs one data through one data pin for one clock cycle in synchronization with rising edges of an external clock.

However, such an SDR memory device is insufficient to satisfy a speed requirement in a high-speed system. Accordingly, a double data rate (DDR) memory device that processes two data for one clock cycle has been proposed.

The DDR memory device inputs/outputs two consecutive data through input/output pins in synchronization with rising and falling edges of the external clock. The DDR memory device can provide at least two times bandwidth as wide as the conventional SDR memory device without increasing the clock frequency, thereby obtaining a higher operation.

However, since the DDR memory device must input/output two data for one clock cycle, data access method employed in the conventional synchronous memory device cannot be used any more.

If the clock cycle is about 10 nsec, two consecutive data must be substantially processed within about 6 nsec or less, except for the rising and falling times (about 0.5×2=2) and time for meeting other specifications. However, it is difficult to perform the process within the memory device. Therefore, the memory device operates in the synchronization with the rising and falling edges of the clock only when inputting/outputting data from/to an external circuit. Substantially, the two data are processed in synchronization with one edge of the clock within the memory device.

In order to transfer data from a memory device to an internal core region or to output the transferred data to an external circuit, a new data access method is required.

Meanwhile, the number of clocks that is counted from an input of a read command to data output is called CAS latency (CL). If CL=3, it means that data are outputted to an external circuit after three clock cycles from an input of the read command. In other words, the CAS latency determines data output timing. The CAS latency is set depending on an operation mode of the memory device and the set value is stored in a special register, which is called EMRS.

FIG. 1 is a block diagram of a conventional memory device.

Referring to FIG. 1, the conventional memory device includes: a command decoder 10 for decoding a command signal to output an internal read signal; a command execution controller 20 for receiving the internal read signal to generate a control signal casp_rd and a buffered internal read signal so as to output corresponding data; a memory cell block 50 for storing a plurality of data and outputting data corresponding to the executing command in response to the control signal casp_rd; a delay locked loop 60 for generating DLL clocks rclk_dll and fclk_dll in order for allowing data to be outputted in synchronization with an external clock (an input clock of the memory device); a data output controller 30 for delaying the internal read signal in response to CL control signals CL2 to CL9 and generating delayed data output enable signals routen and fouten, which are in synchronization with the DLL clocks rclk_dll and fclk_dll; and a data output buffer 40 for outputting data from the memory cell block 50 to an external circuit in response to the data output enable signals routen and fouten.

The data output controller 30 includes a first data output controller 30a for generate the rising data output enable signal routen and a second data output controller 30b for generating the falling data output enable signal fouten.

FIG. 2 is a block diagram of the data output controller shown in FIG. 1. Specifically, FIG. 2 shows the first data output controller 30a for generating the rising data output enable signal routen. The second data output controller 30b for generating the falling data output enable signal fouten has the same structure as the first data output controller 30a.

Referring to FIG. 2, the first data output controller 30a includes: a control clock generating unit 30a_1 for delaying the DLL clocks fclk_dll by a predetermined time in response to the CL control signals CL2 to CL9 and generating control clocks rclkoe10 to rclkoe80; a redundancy enable signal generating unit 30a_3 for shifting the internal read signal in synchronization with the control clocks rclkoe10 to rclkoe0 and generating redundancy enable signals oe10 to oe80; and an output enable signal generating unit 30a_2 for selecting one of the inputted redundancy enable signals oe10 to oe80, which corresponds to the CL control signal.

The redundancy enable signal generating unit 30a_3 includes a plurality of flip-flops. A first flip-flop receives the internal read signal through a data input terminal D and the other flip-flops respectively receive signals outputted from output terminals Q of former stages through data input terminals D. In addition, the respective flip-flops receive the control clocks rclkoe10 to rclkoe80 from the control clock generating unit 30a_1 through respective clock input terminals. The respective flip-flops output the redundancy enable signals oe10 to oe80 through respective output terminals.

FIG. 3 is a waveform showing an operation of the data output controller of FIG. 2.

An operation of the data output controller in the conventional memory device will now be described with reference to FIGS. 1 to 3.

First, the delay locked loop 60 delays the inputted clock for a predetermined time to generate the DLL clocks fclk_dll and rclk_dll. The DLL clocks fclk_dll and rclk_dll are clocks that are internally used to synchronize the output timing of the output data with the rising/falling timing of the external clock.

Meanwhile, if the command signals /CS, /CAS, /RAS and /WE for executing the read command are inputted, the command decoder 10 decodes the inputted command signals /CS, /CAS, /RAS and /WE to generate the internal read signal rd.

The command execution controller 20 generates the control signal casp_rd and the buffered internal read signal read. The memory cell block 50 outputs data corresponding to the current executing read command to the data output buffer 40 in response to the control signal casp_rd.

The data output controller 30 outputs the data output enable signals routen and fouten in response to the CL control signals CL2 to CL9 using the internal read signal read, which is outputted from the command execution controller 20. Then, the data output buffer 40 outputs the data inputted from the memory cell block 50 to the external circuit in response to the data output enable signals routen and fouten.

Next, an operation of the first data output controller 30a will be described below in detail.

The control clock generating unit 30a_1 receives the rising DLL clock rclk_dll and generates the control clocks rclkoe10 to rclkoe80, which are differently delayed depending on the CAS latency modes.

The redundancy clock generating unit 30a_3 shifts the buffered internal read signal read using the flip-flops. At this point, the control clocks rclkoe10 to rclkoe80 outputted from the control clock generating unit 30a_1 are inputted to the clock input terminals of the respective flip-flops.

The respective flip-flops output the redundancy enable signals oe10 to oe80 corresponding to the CAS latency to the output enable signal generating unit 30a_2.

Then, the output enable signal generating unit 30a_2 selects one of the redundancy enable signals oe10 to oe80 depending on the set CAS latency modes and outputs the selected redundancy enable signal as the rising data output enable signal routen.

In FIG. 3, in case where the CAS latency mode is 3, the rising data output enable signal routen is outputted when the redundancy enable signal oe30 is selected at the output enable signal generating unit 30a_2.

However, as the operating speed of the memory device is increasing higher, a margin for generating the rising data output enable signal routen at the data output controller 30 is gradually decreased.

Further, while the conventional memory device operates in the CAS latency mode ranging from 2 to 4, the synchronous memory device requires an increased CAS latency mode. In recent years, the memory device is required to operate in a wider CAS latency mode ranging from 2 to 9.

In order for the memory device to operate in the CAS latency mode ranging from 2 to 9, the redundancy enable signal generating unit 30a_3 is configured with seven flip-flops. In case of CL=9, a signal passing through eight flip-flops is outputted as the rising data output enable signal routen.

As the number of flip-flops to be passed for generating the rising data output enable signal routen is larger, the operation margin of the data output controller is decreased greater due to the margins of the respective flip-flops (X, in FIG. 3).

Accordingly, when the memory device operates in the wide CAS latency mode ranging from 2 to 9, the operation margin of the data output controller is decreased, thus making it impossible to operate the memory device at a high frequency.

SUMMARY OF THE INVENTION

It is, therefore, an object of the present invention to provide a synchronous memory device, which is capable of providing wide-ranging CAS latency modes and stably operating at high frequency because of an improved operation margin.

In an aspect of the present invention, there is provided a memory device configured to generate a data output enable signal corresponding to a set CAS latency mode, wherein the memory device includes: a control clock generator for generating an A-type first control clock and a B-type first control clock, the A-type first control clock being supplied by dividing DLL clock by two, the B-type first control clock being an inversed A-type first control clock; a first redundancy enable signal generator for shifting an internal read signal by a predetermined interval in synchronization with one of the A-type first control clock and the B-type first control clock and generating a plurality of first redundancy enable signals, the internal read signal being generated corresponding to a read command; a second redundancy enable signal generator for synchronizing the plurality of first redundancy enable signals with the DLL clock and generating a plurality of second redundancy enable signals; and an output enable signal generator for selecting one redundancy enable signal corresponding to the set CAS latency mode among the first redundancy enable signals and the second redundancy enable signals and generating the selected redundancy enable signal as the data output enable signal.

In another aspect of the present invention, there is provided a memory device having a data output control circuit configured to generate a data output enable signal corresponding to a set CAS latency mode, wherein the memory device includes: a clock divider for generating an A-type first control clock and a B-type first control clock, the A-type first control clock being supplied by dividing DLL clock signal by two, the B-type first control clock being an inverted A-type first control clock; an A-type first control clock generator for adjusting a delay value of the A-type first control clock according to CAS latency modes; a B-type first control clock generator for adjusting a delay value of the B-type first control clock according to the CAS latency modes; a first redundancy enable signal generator for shifting an internal read signal by a predetermined interval in synchronization with the output of the A-type first control signal generator or the output of the B-type first control clock generator and generating a plurality of first redundancy enable signals, the internal read signal being generated corresponding to a read command; a second control clock generator for delaying the DLL clock by a predetermined delay value according to respective CAS latency modes; a second redundancy enable signal generator for shifting the plurality of first redundancy enable signals by a predetermined interval in synchronization with an output of the second control clock generator and generating a plurality of second redundancy enable signals; and an output enable signal generator for selecting a redundancy enable signal among the first redundancy enable signals and the second redundancy enable signals in response to a set CAS latency mode and outputting the selected redundancy enable signal as the data output enable signal.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE INVENTION

Hereinafter, the present invention will be described in detail with reference to the accompanying drawings.

Figure 4:
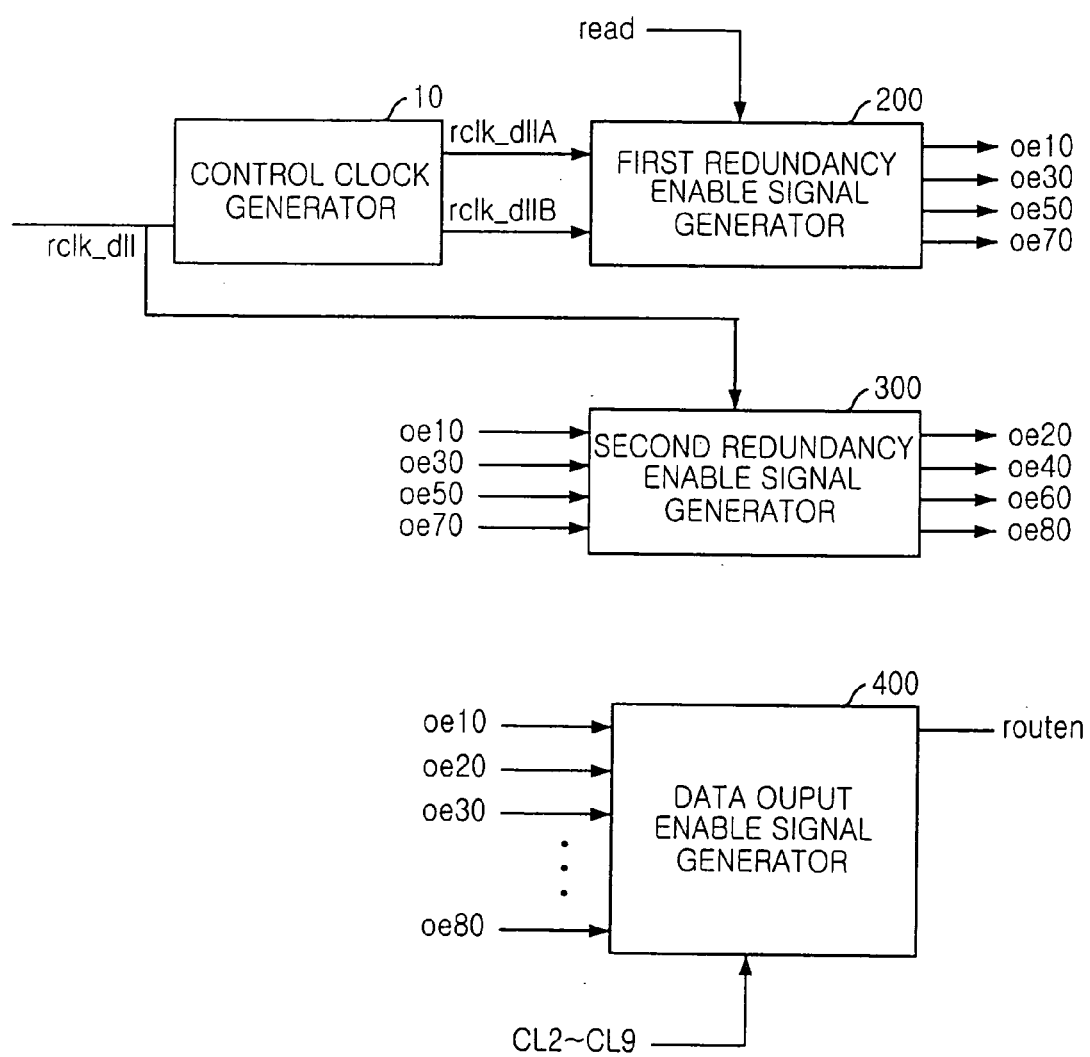
FIG. 4 is a block diagram illustrating a data output controller of a memory device in accordance with a first embodiment of the present invention.

FIG. 4 is a block diagram illustrating a data output controller of a memory device in accordance with one embodiment of the present invention.

Referring to FIG. 4, a data output controller of a memory device in accordance with an embodiment of the present invention includes a control clock generator 100, a first redundancy enable signal generator 200, a second redundancy enable signal generator 300, and an output enable signal generator 400.

The control clock generator 100 generates an A-type first control clock rclk_dllA and a B-type first control clock rclk_dllB in order to output a data output enable signal routen according to a selected CAS latency mode (CL=2 to CL=9). The A-type first control clock rclk_dllA is a clock that is supplied by dividing DLL clock signal rclk_dll by two and the B-type first control clock rclk_dllB is an inverted A-type first control clock.

The first redundancy enable signal generator 200 shifts an internal read signal read, which is generated in response to a read command, by a predetermined interval in synchronization with the A-type first control signal rclk_dllA or the B-type first control clock rclk_dllB and generates a plurality of first redundancy enable signals oe10, oe30, oe50 and oe70.

The second redundancy enable signal generator 300 synchronizes the first redundancy enable signals oe10, oe30, oe50 and oe70 with the DLL clock signal rclk_dll and generates a plurality of second redundancy enable signals oe20, oe40, oe60 and oe80.

The output enable signal generator 400 selects a signal among the first redundancy enable signals oe10, oe30, oe50 and oe70 and the second redundancy enable signals oe20, oe40, oe60 and oe80 in response to a set CAS latency mode and outputs the selected redundancy enable signal as the data output enable signal routen. Here, in FIG. 4, there is mainly shown a block for generating the rising data output enable signal routen in order to output data in synchronization with a rising edge of the DLL clock. Since a block for generating a falling data output enable signal fouten is similar to the block for generating the rising data output enable signal routen, its detailed description will be omitted.

First, the data output controller in accordance with the present invention generates the A-type first control clock rclk_dllA and the B-type first control clock rclk_dllB. Then, Using one of the control clocks rclk_dllA and rclk_dllB, the internal read signal read is synchronized and shifted to generate the first redundancy enable signals oe10, oe30, oe50 and oe70.

The first redundancy enable signals oe10, oe30, oe50 and oe70 are synchronized with the DLL clock rclk_dll and are shifted to generate the second redundancy enable signals oe20, oe40, oe60 and oe80.

One signal is selected among the first redundancy enable signals oe10, oe30, oe50 and oe70 and the second redundancy enable signals oe20, oe40, oe60 and oe80 in response to the CAS latency control signals CL2 to CL9, which are inputted corresponding to the CAS latency modes. The selected signal is outputted as the data output enable signal routen.

Meanwhile, in case the operating frequency is relatively low, the signals outputted from the first redundancy enable signal generator 200 and the second redundancy enable signal generator 300 are used in the above-described manner. However, in case the operating frequency is high, the output timings of the first redundancy enable signals oe10, oe30, oe50 and oe70 and the second redundancy enable signals oe20, oe40, oe60 and oe80 must be adjusted according to the CAS latency modes in order for the memory device to output the data at the normal timing.

Accordingly, in the memory devices adopting DDR-II, signals outputted from the first redundancy enable signal generator 200 and the second redundancy enable signal generator 300 are adjusted according to the CAS latency mode and then outputted to an external circuit.

Figure 5:
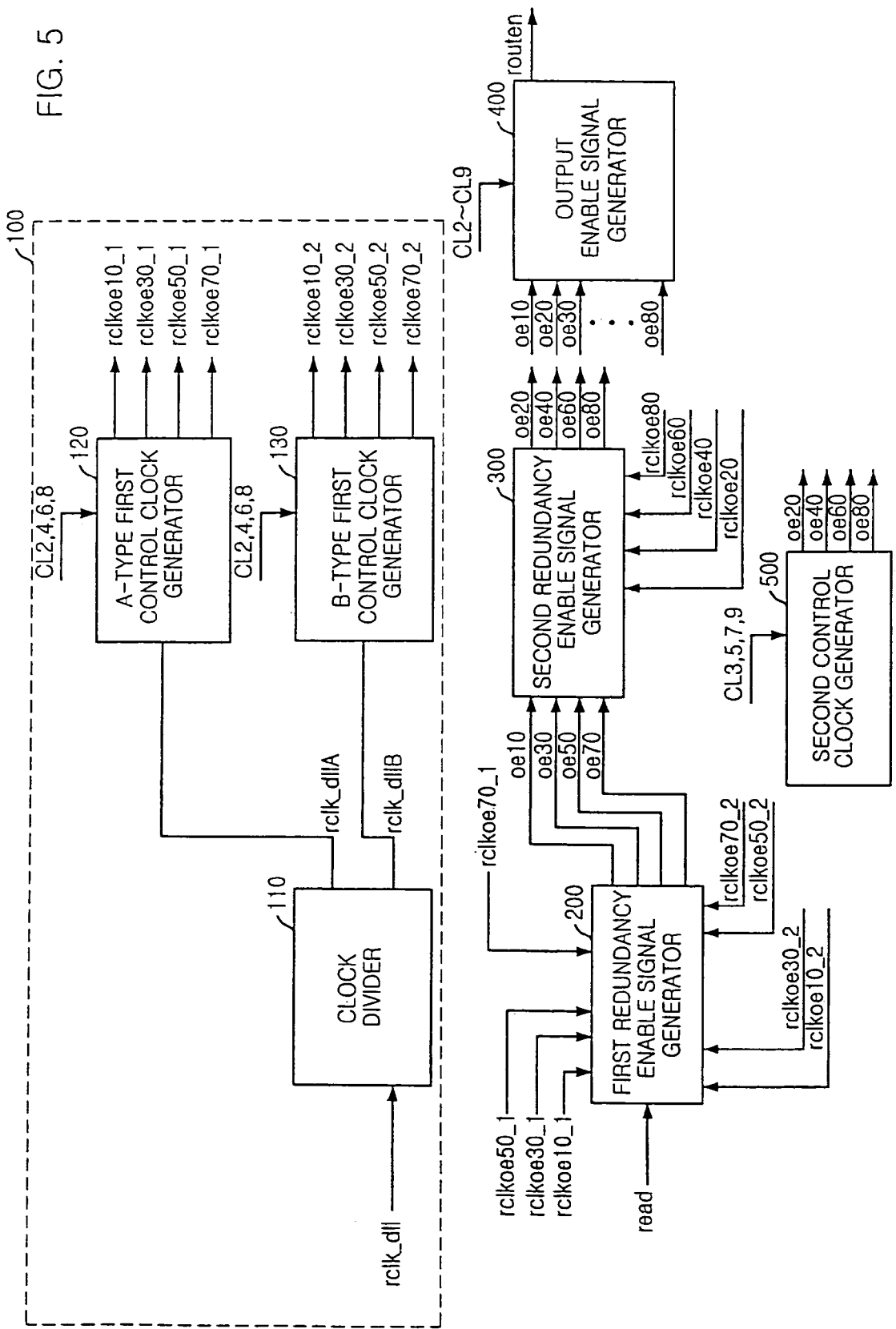
FIG. 5 is a block diagram illustrating a data output controller of a memory device in accordance with a second embodiment of the present invention.

FIG. 5 is a block diagram illustrating a data output controller of a memory device according to another embodiment of the present invention. As described above, the data output controller of FIG. 5 outputs signals that are adjusted corresponding to the CAS latency mode at the first and second redundancy signal generators.

Referring to FIG. 5, a data output controller data of a memory device in accordance with another embodiment of the present invention includes a clock divider 110, an A-type first control clock generator 120, a B-type first control clock generator 130, a first redundancy enable signal generator 200, a second control clock generator 500, a second redundancy enable signal generator 300, and an output enable signal generator 400.

The clock divider 110 generates an A-type first control clock rclk_dllA and a B-type first control clock rclk_dllB in order to output a data output enable signal according to a selected CAS latency mode. The A-type first control clock rclk_dllA is a clock that is supplied by dividing DLL clock signal rclk_dll by two and the B-type first control clock is an inverted A-type first control clock.

The A-type first control clock generator 120 adjusts a delay value of the A-type first control clock rclk_dllA according to a CAS latency mode (CL=2, 4, 6, 8). The B-type first control clock generator 130 adjusts a delay value of the B-type first control clock rclk_dllB according to the CAS latency mode (CL=2, 4, 6, 8).

The first redundancy enable signal generator 200 shifts an internal read signal read, which is generated in response to a read command, by a predetermined interval in synchronization with the output of the A-type first control signal generator 120 or the output of the B-type first control clock generator 130 and generates a plurality of first redundancy enable signals oe10, oe30, oe50 and oe70.

The second control clock generator 500 adjusts a delay value of the DLL clock rclk_dll according to the CAS latency mode (CL=3, 5, 7, 9).

The second redundancy enable signal generator 300 shifts the first redundancy enable signals oe10, oe30, oe50 and oe70 by a predetermined interval in synchronization with an output of the second control clock generator 500 and generates a plurality of second redundancy enable signals oe20, oe40, oe60 and oe80.

The output enable signal generator 400 selects a signal (CL2 to CL9) among the first redundancy enable signals oe10, oe30, oe50 and oe70 and the second redundancy enable signals oe20, oe40, oe60 and oe80 in response to a set CAS latency mode and outputs the selected redundancy enable signal as the data output enable signal routen.

Figure 6:
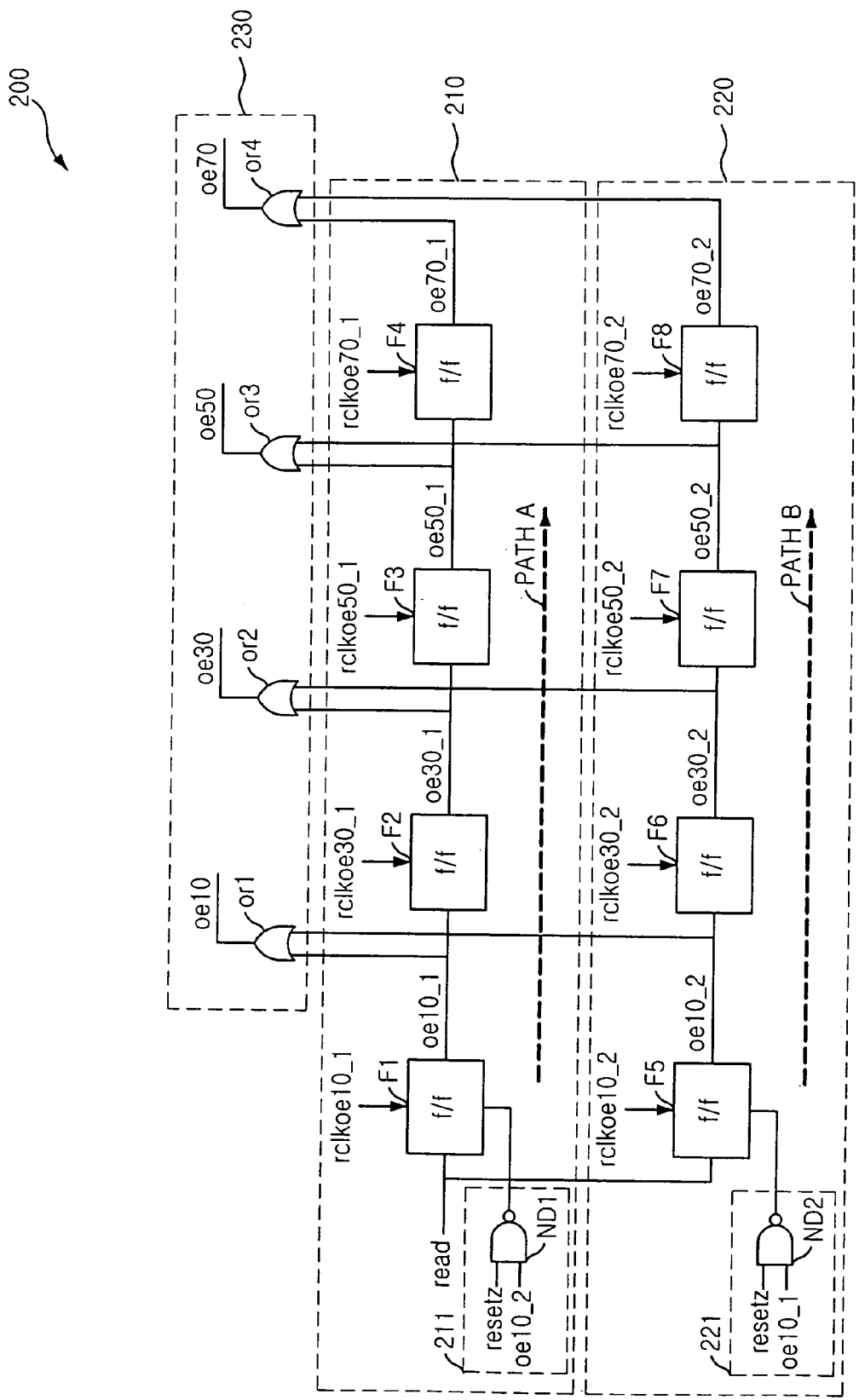
FIG. 6 is a circuit diagram of a first redundancy enable signal generator shown in FIG. 5.

FIG. 6 is a circuit diagram of the first redundancy enable signal generator shown in FIG. 5.

Referring to FIG. 6, the first redundancy enable signal generator 200 includes a first signal shifter 210, a second signal shifter 220, and a signal combiner 230.

The first signal shifter 210 shifts the internal read signal read in sequential synchronization with signals rclkoe10_1 to rclkoe70_1, which are outputted from the A-type first control clock generator 120, and generates internal signals oe10_1, oe30_1, oe50_1 and oe70_1.

The second signal shifter 220 shifts the internal read signal read in sequential synchronization with signals rclkoe10_2 to rclkoe70_2, which are outputted from the B-type first control clock generator 130, and generates internal signals oe10_2, oe30_2, oe50_2 and oe70_3.

The signal combiner 230 combines the output signals of the first and second signal shifters 210 and 220 and generates the first redundancy enable signals oe10, oe30, oe50 and oe70 to the output enable signal generator 400. Here, the first and second shifters 210 and 220 selectively shift the internal read signal read. In other words, if one shifter begins to perform the shifting operation, the other shifter is disabled.

In more detail, if the internal signal oe10_1 is outputted from the first signal shifter 210, a flip-flop F5 of the second signal shifter 220 is reset. If the internal signal oe10_2 is outputted from the second signal shifter 220, a flip-flop F1 of the first signal shifter is reset.

Also, the first signal shifter 210 includes a flip-flop F1, a plurality of flip-flops F2 to F4, and a first logic combination unit 211. The flip-flop F1 outputs the internal read signal read in synchronization with the output signal rclkoe10_1 of the A-type first control clock generator 120. The flip-flops F2 to F4 sequentially shift the output signal of the flip-flop F1 in synchronization with the output signals rclkoe30_1 to rclkoe70_1 of the A-type first control clock generator 120, which are adjusted according to the CAS latency mode. If the second signal shifter 220 shifts the internal read signal read, the first logic combination unit 211 transfers a reset signal to the flip-flop F1.

The second signal shifter 220 includes a flip-flop F5, a plurality of flip-flops F6 to F8, and a second logic combination unit 221. The flip-flop F5 outputs the internal read signal read in synchronization with the output signal rclkoe10_2 of the B-type first control clock generator 130. The flip-flops F6 to F8 sequentially shift the output signal of the flip-flop F5 in synchronization with the output signals rclkoe30_2 to rclkoe70_2 of the B-type first control clock generator 130. If the first signal shifter 210 shifts the internal read signal read, the second logic combination unit 221 transfers a reset signal to the flip-flop F5.

The signal combiner 230 includes a first OR gate or1 and a plurality of second OR gates or2, or3 and or4. The first OR gate or1 performs a logical AND operation on the output signal oe10_1 of the flip-flop F1 and the output signal oe10_2 of the flip-flop F5, and then outputs the first redundancy enable signal oe10. The second OR gates or2, or3 and or4 perform logical AND operations on the output signals oe30_1, oe50_1 and oe70_1 of the flip-flops F2, F3 and F4 and the output signals oe30_2, oe50_2 and oe70_2 of the flip-flops F6, F7 and F8, and then generate the first redundancy enable signals oe30, oe50 and oe70, respectively. Here, the flip-flops F1 to F8 are configured with D flip-flops.

Figure 7:
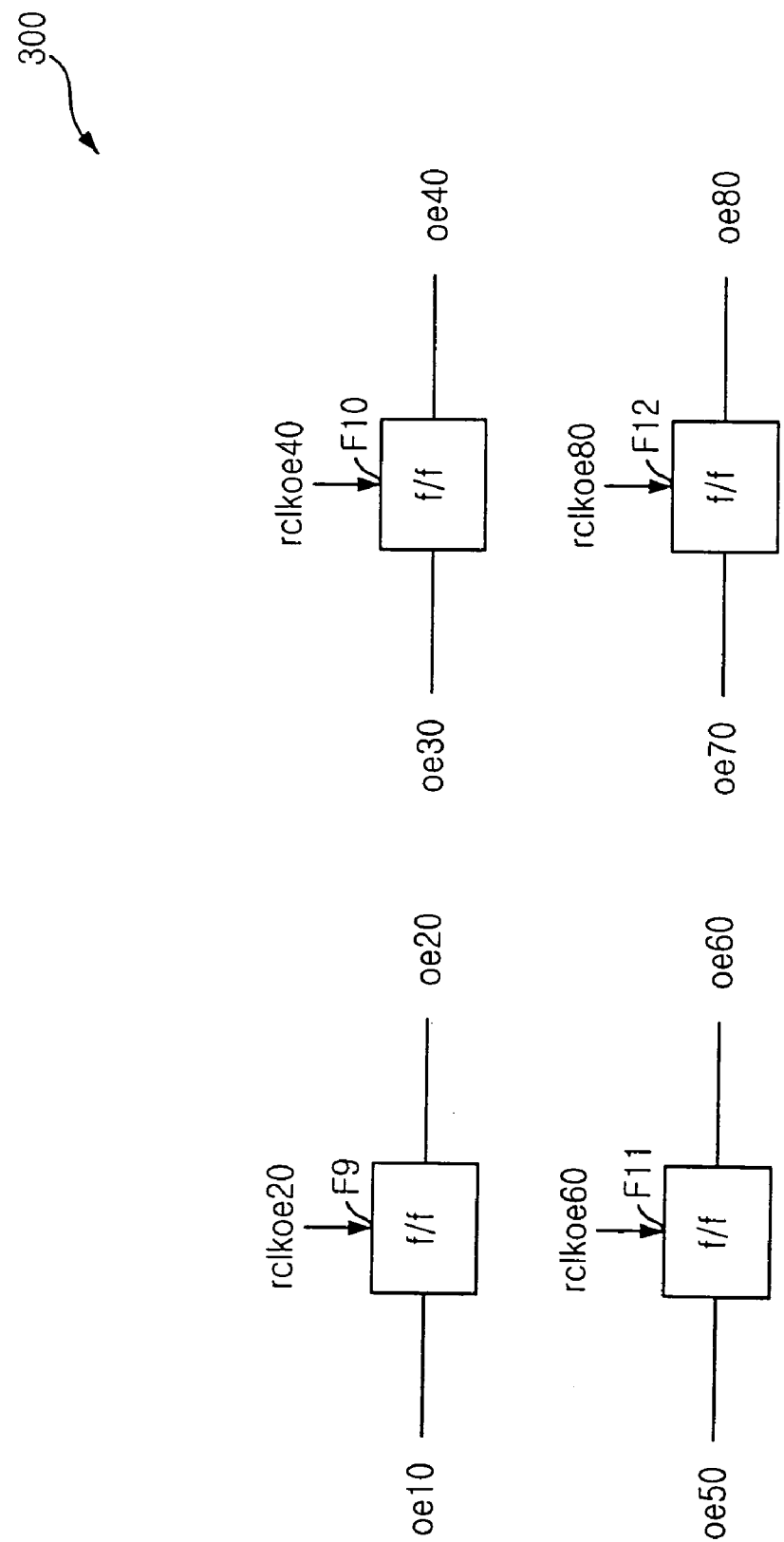
FIG. 7 is a circuit diagram of a second redundancy enable signal generator shown in FIG. 5.

FIG. 7 is a circuit diagram of the second redundancy enable signal generator shown in FIG. 5.

Referring to FIG. 7, the second redundancy enable signal generator 300 includes a plurality of flip-flops F9 to F12 that synchronize the first redundancy enable signals oe10, oe30, oe50 and oe70 with third driving control clocks rclkoe20, rclkoe40, rclkoe60 and rclkoe80, which are outputted from the second control clock generator according to the CAS latency mode, and output the second redundancy enable signals oe20, oe40, oe60 and oe80. Here, the flip-flops F9 to F12 are configured with D flip-flops having clock input terminals receiving the third driving control clocks rclkoe20, rclkoe40, rclkoe60 and rclkoe80 and data input terminals receiving the first redundancy enable signals oe10, oe30, oe50 and oe70, respectively.

Figure 8:
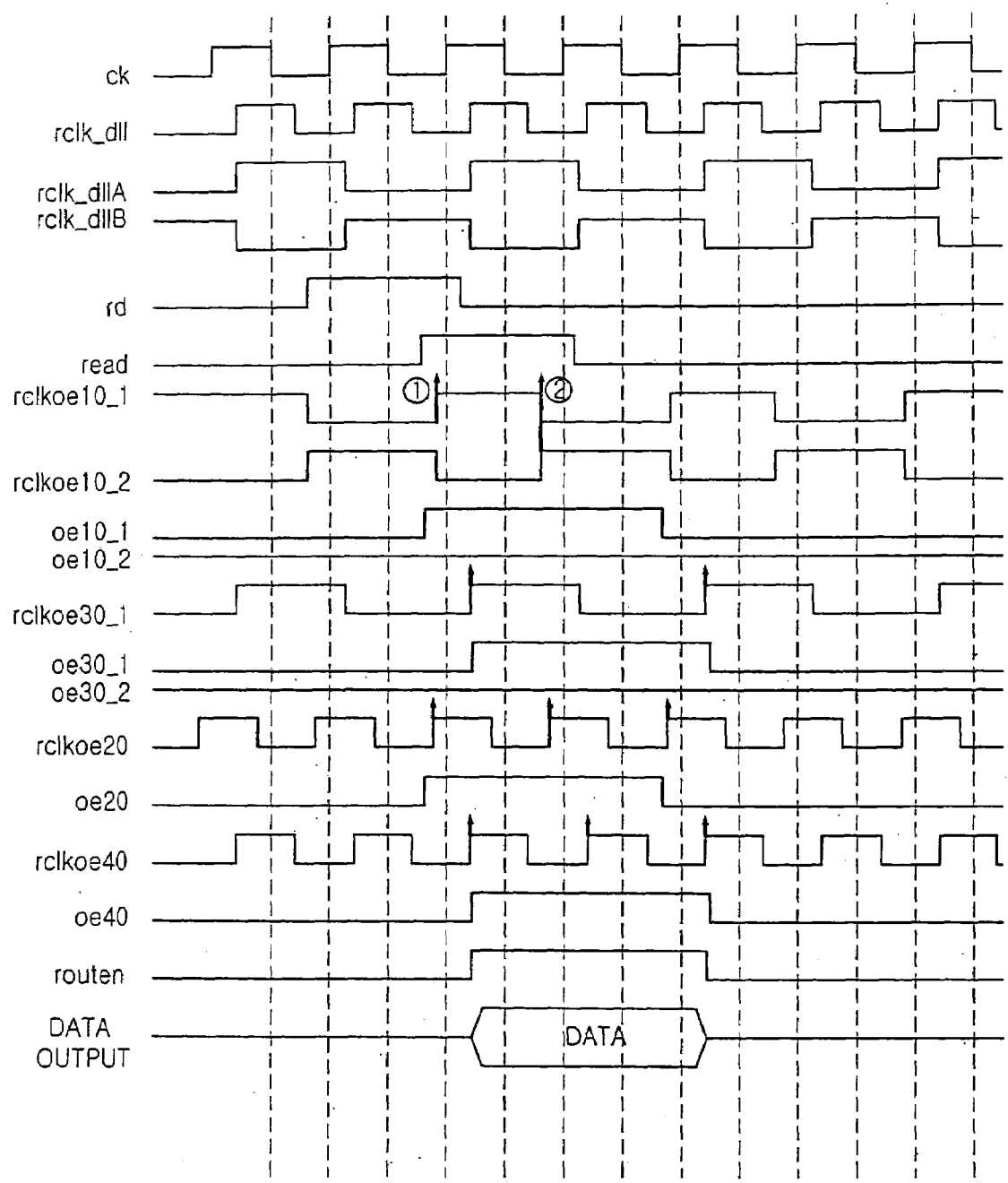
FIG. 8 is a waveform illustrating an operation of the data output controller shown in FIG. 5.

FIG. 8 is a waveform illustrating an operation of the data output controller shown in FIG. 5. An operation of the data output controller according to the present invention will now be described with reference to FIGS. 5 to 8.

Figure 1:
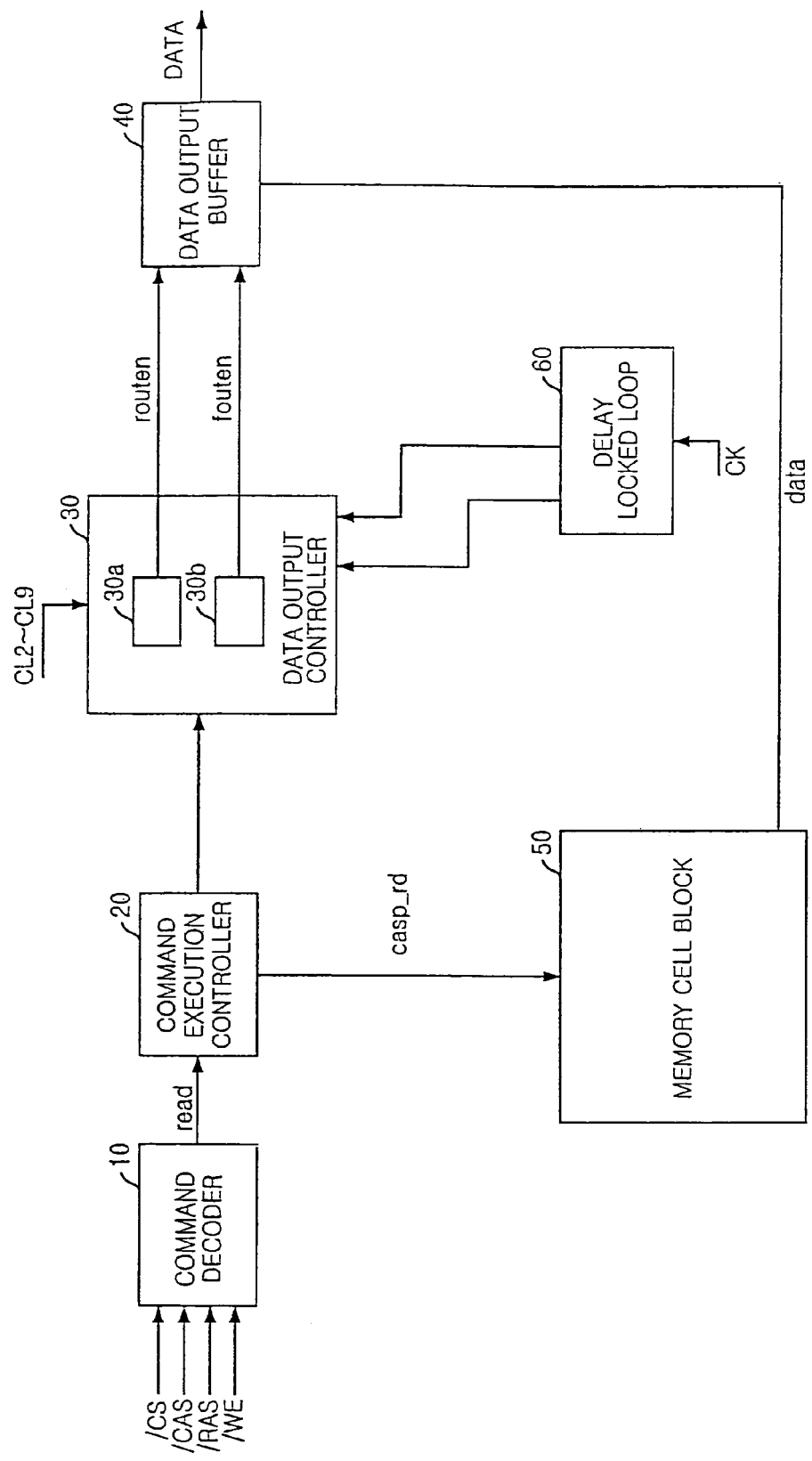
FIG. 1 is a block diagram of a conventional memory device.
Figure 2:
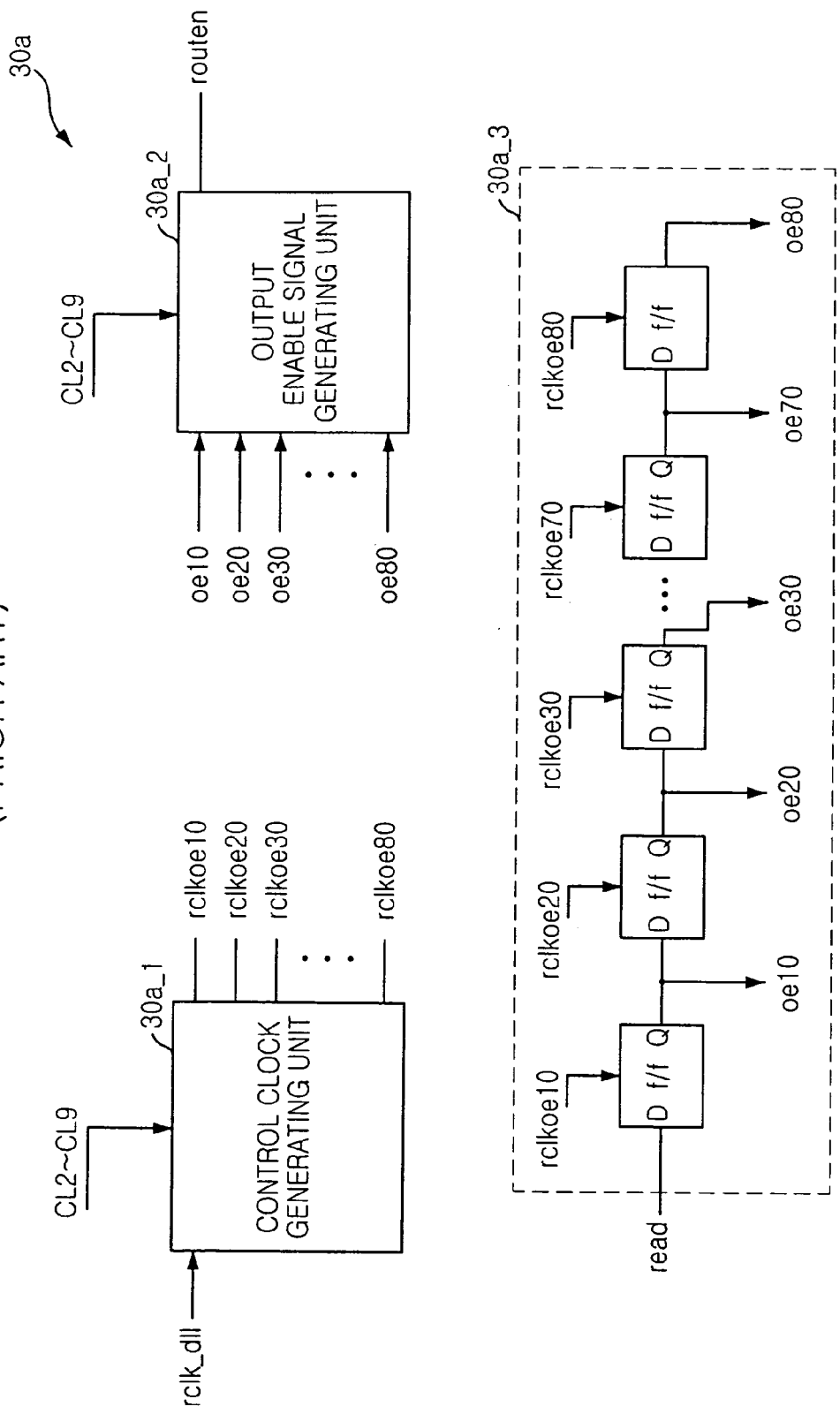
FIG. 2 is a block diagram of a data output controller shown in FIG. 1.
Figure 3:
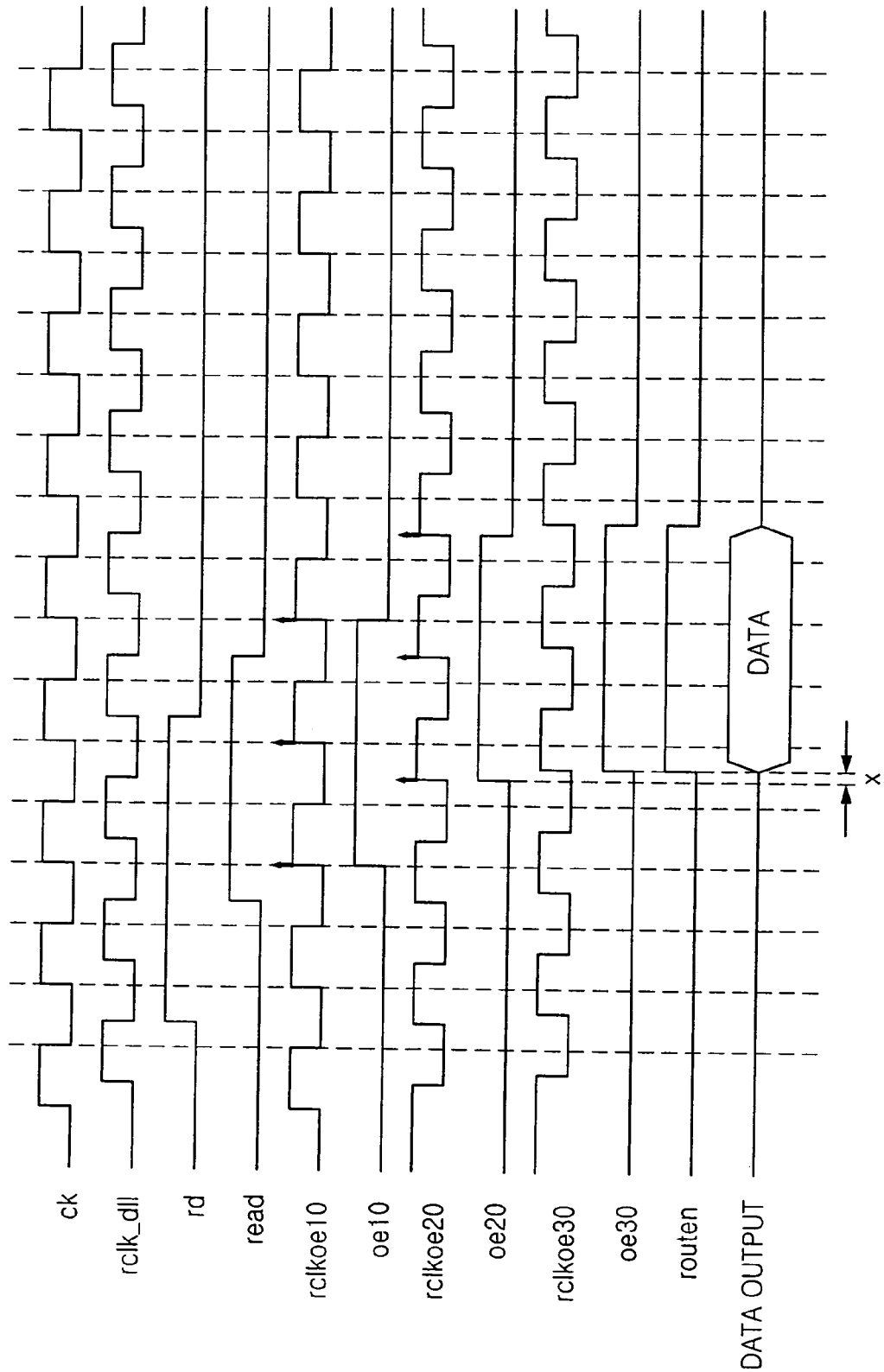
FIG. 3 is a waveform showing an operation of the data output controller of FIG. 2.

First, the clock divider 110 receives the DLL clock rclk_dll from the delay locked loop (refer to FIG. 1) and generates the A-type first control clock rclk_dllA and the B-type first control clock rclk_dllB. Here, the A-type first control clock rclk_dllA is a clock that is supplied by dividing DLL clock signal rclk_dll by two and the B-type first control clock is an inverted A-type first control clock.

Then, the A-type first control clock generator 120 sequentially delays the A-type first control clock rclk_dllA by a predetermined delay value corresponding to the CAS latency mode (CL=2, 4, 6, 8) and generates the first driving control clocks rclkoe10_1 to rclkoe70_1. Also, the B-type first control clock generator 130 sequentially delays the B-type first control clock rclk_dllB by the predetermined delay value corresponding to the CAS latency mode (CL=2, 4, 6, 8) and generates the second driving control clocks rclkoe10_2 to rclkoe70_2.

The first redundancy enable signal generator 200 shifts the internal read signal read by a predetermined interval in synchronization with the first driving control clocks rclkoe10_1 to rclkoe70_1 or the second driving control clocks rclkoe10_2 to rclkoe10_2 and generates the first redundancy enable signals oe10, oe30, oe50 and oe70. Here, since the A-type first control clock rclk_dllA and the B-type control clock rclk_dllB are inverse to each other, the first driving control clocks rclkoe10_1 to rclkoe70_1 and the second driving control clocks rclkoe10_2 to rclkoe70_2 are also inverse to each other.

The first redundancy enable signal generator 200 includes the first signal shifter 210 and the second signal shifter 220, each of which is configured with a plurality of flip-flops. If one of the two shifters performs the shifting operation, the other stops its operation.

For example, if the flip-flop F1 of the first signal shifter 210 transfers the internal read signal read in synchronization with the first driving control clock rclkoe10_1, the flip-flop F5 of the second signal shifter 220 is reset in response to the transferred signal oe10_1.

It can be seen from FIG. 8 that the second signal shifter 220 stops the signal shifting operation when the first signal shifter 210 shifts the internal read signal.

Referring to FIG. 8, the first signal shifter 210 and the second signal shifter 220 begin to shift the internal read signal from positions ① and ②, respectively. The flip-flop F1 of the first signal shifter 210 first detects a low-to-high transition of the internal read signal read at the position ①. Thus, the first signal shifter 210 performs the signal shifting operation to output the shifted signals oe10_1, oe30_1, oe50_1 and oe70_1. Then, the signal combiner 230 receives the shifted signals and outputs the first redundancy enable signals oe10, oe30, oe50 and oe70.

On the other hand, the flip-flop F5 of the second shifter 220 is stopped in response to the output signal oe10_1 of the flip-flop F1, such that the second shifter 220 stops the signal shifting operation. Therefore, all the shifted signals oe10_1, oe30_1, oe50_1 and oe70_1 that are outputted from the second signal shifter 220 are locked to low levels.

Meanwhile, the second control clock generator 500 sequentially delays the DLL clock rclk_dll by a predetermined delay value corresponding to the CAS latency mode (CL=3, 5, 7, 9) and outputs the second control clocks rclkoe20, rclkoe40, rclkoe60 and rclkoe80.

The second redundancy enable signal generator 300 synchronize the first redundancy enable signals oe10, oe30, oe50 and oe70 with the second control clocks rclkoe20, rckloe40, rclkoe60 and rclkoe80 and generates the second redundancy enable signals oe20, oe40, oe60 and oe80.

The output enable signal generator 400 selects one signal corresponding to the set CAS latency mode among the first redundancy enable signals oe10, oe30, oe50 and oe70 and the second redundancy enable signals oe20, oe40, oe60 and oe80 and outputs the selected signal as the data output enable signal routen. Here, the signals oe10 to oe80 that are inputted to the output enable signal generator 400 are signals that are inputted corresponding to the CAS latency modes CL2 to CL9, respectively.

Then, data corresponding to the read command that is executed during a period when the data output enable signal routen from the output enable signal generator 400 is enabled to a high level is outputted from the data output buffer to the outside of the memory device.

As described above, if the synchronous memory device generates the data output enable signal, the wide-ranging CAS latency mode (CL=2 to CL=9) is provided. Since the shifting operation for generating the data output enable signal is performed half as little as that of the prior art, the operation margin for generating the data output enable signal routen is greatly increased.

For example, even in the case of CL=9, the data output enable signal routen is generated using the signals that are shifted at the four flip-flops of the first redundancy enable signal generator 200. Therefore, the operation margin of the data output controller is greatly increased, compared with the prior art that uses eight flip-flops.

Further, in accordance with the present invention, the number of flip-flops provided at the data output controller is decreased compared with the prior art, such that a circuit area of the data output circuit is reduced.

Although the embodiments uses two-divided DLL clock, it is also possible to generate the redundancy enable signals in response to four control clocks generated through four division. This case can be applied to a memory device having a burst length of 8 or more.

In the synchronous memory device that outputs data according to the CAS latency, the operation margin of the memory device is increased when the data output enable signal corresponding to the CAS latency mode is generated. Because of the increased operation margin, it is advantageous for the memory device to operate at high frequency. Further, the number of flip-flops used in the data output circuit is greatly decreased, thereby obtaining effects such as reductions in power consumption, circuit area, and so on.

The present application contains subject matter related to Korean patent application No. 2003-76834, filed in the Korean Patent Office on Oct. 31, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A memory device configured to generate a data output enable signal corresponding to a set CAS latency mode, the memory device comprising:
   a control clock generator for generating an A-type first control clock and a B-type first control clock, the A-type first control clock being supplied by dividing DLL clock by two, the B-type first control clock being an inversed A-type first control clock;
   a first redundancy enable signal generator for shifting an internal read signal by a predetermined interval in synchronization with one of the A-type first control clock and the B-type first control clock and generating a plurality of first redundancy enable signals, the internal read signal being generated corresponding to a read command;
   a second redundancy enable signal generator for synchronizing the plurality of first redundancy enable signals with the DLL clock and generating a plurality of second redundancy enable signals; and
   an output enable signal generator for selecting one redundancy enable signal corresponding to the set CAS latency mode among the first redundancy enable signals and the second redundancy enable signals and generating the selected redundancy enable signal as the data output enable signal.

2. A memory device with a data output control circuit configured to generate a data output enable signal corresponding to a set CAS latency mode, the memory device comprising:
   a clock divider for generating an A-type first control clock and a B-type first control clock, the A-type first control clock being supplied by dividing DLL clock signal by two, the B-type first control clock being an inverted A-type first control clock;
   an A-type first control clock generator for adjusting a delay value of the A-type first control clock according to CAS latency modes;
   a B-type first control clock generator for adjusting a delay value of the B-type first control clock according to the CAS latency modes;
   a first redundancy enable signal generator for shifting an internal read signal by a predetermined interval in synchronization with the output of the A-type first control signal generator or the output of the B-type first control clock generator and generating a plurality of first redundancy enable signals, the internal read signal being generated corresponding to a read command;
   a second control clock generator for delaying the DLL clock by a predetermined delay value according to respective CAS latency modes;
   a second redundancy enable signal generator for shifting the plurality of first redundancy enable signals by a predetermined interval in synchronization with an output of the second control clock generator and generating a plurality of second redundancy enable signals; and
   an output enable signal generator for selecting a redundancy enable signal among the first redundancy enable signals and the second redundancy enable signals in response to a set CAS latency mode and outputting the selected redundancy enable signal as the data output enable signal.

3. The memory device as recited in claim 2, wherein the A-type first control clock generator delays the A-type control clock by a predetermined interval according to the respective CAS latency modes and outputs a plurality of first driving control clocks, and the B-type first control clock generator delays the B-type control clock by a predetermined interval according to the respective CAS latency modes and outputs a plurality of second driving control clocks.

4. The memory device as recited in claim 3, wherein the first redundancy enable signal generator includes:
 a first signal shifter for sequentially shifting the internal read signal in synchronization with the plurality of first driving control clocks and generating a plurality of first internal signals;
 a second signal shifter for sequentially shifting the internal read signal in synchronization with the plurality of second driving control clocks and generating a plurality of second internal signals; and
 a signal combiner for combining the output signals of the first and second signal shifters and generating the first redundancy enable signals the output enable signal generator 400,
 wherein the first and second shifters selectively shift the internal read signal, such that if one shifter begins to perform the shifting operation, the other shifter is disabled.

5. The memory device as recited in claim 4, wherein the first signal shifter includes:
 a first flip-flop for outputting the internal read signal in synchronization with the A-type first control clock;
 a plurality of second flip-flops for sequentially shifting an output signal of the first flip-flop in synchronization with the A-type first control clock; and
 a first logic combination unit for transferring a reset signal to the first flip-flop when the second signal shifter shifts the internal read signal.

6. The memory device as recited in claim 5, wherein the second signal shifter includes:
 a third flip-flop for outputting the internal read signal in synchronization with an output signal of the B-type first control clock generator;
 a plurality of fourth flip-flops for sequentially shifting the output signal of the third flip-flop in synchronization with the output signals of the B-type first control clock generator, which are adjusted according to the CAS latency modes; and
 a second logic combination unit for transferring a reset signal to the third flip-flop when the first signal shifter shifts the internal read signal.

7. The memory device as recited in claim 6, wherein a signal combiner includes:
 a first OR gate for performing a logical AND operation on the output signals of the first and third flip-flops and outputting one of the first redundancy enable signals; and
 a plurality of second OR gates for performing logical AND operations on the output signals of the second and fourth flip-flops and outputting the remaining first redundancy enable signals, respectively.

8. The memory device as recited in claim 7, wherein the first to fourth flip-flops are configured with D flip-flops.

9. The memory device as recited in claim 2, wherein the second redundancy enable signal generator includes a plurality of flip-flops for synchronizing the plurality of first redundancy enable signals with the plurality of second driving control clocks and outputting the plurality of second redundancy enable signals, the plurality of second driving control clocks being adjusted according to the CAS latency modes.

10. The memory device as recited in claim 9, wherein the plurality of flip-flops are configured with D flip-flops having clock input terminals receiving the second driving control clocks and data input terminals receiving the first redundancy enable signals, respectively.

* * * * *